United States Patent [19]

Kaise et al.

[11] Patent Number: 5,302,839
[45] Date of Patent: Apr. 12, 1994

[54] LIGHT EMITTING DIODE HAVING AN IMPROVED GAP COMPOUND SUBSTRATE FOR AN EPITAXIAL GROWTH LAYER THEREON

[75] Inventors: Tsuneyuki Kaise, Annaka; Toshio Otaki, Takasaki; Jun Ikeda, Iwaki, all of Japan

[73] Assignee: Shin-Etsu Handotai Co., Ltd., Tokyo, Japan

[21] Appl. No.: 919,340

[22] Filed: Jul. 27, 1992

[30] Foreign Application Priority Data

Jul. 29, 1991 [JP] Japan ................... 3-212846

[51] Int. Cl.$^5$ .......................................... H01L 33/00
[52] U.S. Cl. ................... 257/101; 257/102; 257/103; 372/43
[58] Field of Search ............. 257/87, 89, 101, 102, 257/103; 372/43

[56] References Cited

U.S. PATENT DOCUMENTS 4,017,880  4/1977  Kasami et al. ............. 257/102

FOREIGN PATENT DOCUMENTS 53-61287   6/1978  Japan ............. 257/102
53-82280   7/1978  Japan ............. 257/101
1-245569   9/1989  Japan ............. 257/101
2006043    5/1979  United Kingdom .

OTHER PUBLICATIONS

Patent Abstracts of Japan, vol. 10, No. 71, (C-334) (2128), 20 May 1986 & JP-A-60 210 599,23, Oct. 1985, Tsuji.
Journal of Applied Physics, vol. 45, No. 1, Jan. 1974, New York US, pp. 243-245, Kim, "Total Oxygen Content of Gallium Phosphide Grown by the Czochralski Technique Using Liquid Encapsulation".
Journal of Applied Physics, vol. 44, No. 10, Oct. 1973, New York US, pp. 4758-4768, Lightowlers, "Nuclear Microanalysis of Oxygen Concentration in Liquid--Phase Epitaxial Gallium Phoshide".
Journal of the Electrochemical Society, vol. 120, No. 8, Aug. 1973, Manchester, N.H. US, pp. 1128-1131, Saul, "Vapor Doped Multislice LPE Fot Efficient GaP Green Leds".

*Primary Examiner*—Rolf Hille
*Assistant Examiner*—Minhloan Tran
*Attorney, Agent, or Firm*—Nikaido, Marmelstein, Murray & Oram

[57] ABSTRACT

A compound semiconductor single crystal which has an Si concentration of not more than $1 \times 10^{17}$ atoms/cm$^3$ and/or an O concentration of not more than $7 \times 10^{16}$ atoms/cm$^3$ is particularly suitable for use as substrate for epitaxial deposition of a high luminance light-emitting device which emits green light.

6 Claims, 2 Drawing Sheets

LIGHT EMITTING DIODE HAVING AN IMPROVED GAP COMPOUND SUBSTRATE FOR AN EPITAXIAL GROWTH LAYER THEREON

BACKGROUND OF THE INVENTION

1. Field of the Invention

The present invention relates generally to a compound semiconductor single crystal suitable for use as a substrate for epitaxial deposition of a light emitting device which emits green light, and more particularly to a GaP single crystal.

2. Description of the Prior Art

The demand for high luminance GaP green-light light-emitting diodes (LEDs) has increased year after year. However, since luminance reduction is caused by various reasons, a satisfactory solution to the foregoing demand has not been proposed. For example, when a liquid-phase epitaxial layer is deposited on a GaP single crystal substrate to fabricate an epitaxial wafer for a green light LED, a problem occurs in that the luminance at a particular portion of the substrate becomes inadequate.

Through an investigation on the impurity concentration of GaP single crystal substrates involving the inadequate luminance problem and of GaP single crystal substrate free from the inadequate luminance problem, the present inventors have found that a definite correlation exists between the luminance and the concentrations of particular impurities. Based on this finding, the present inventors have completed the present invention.

SUMMARY OF THE INVENTION

It is an object of this invention to provide a compound semiconductor single crystal, and in particular a GaP single crystal, which is suitable for use as a substrate for epitaxial deposition of light-emitting devices which emit green light which are free from the inadequate luminance problem.

To attain the foregoing object, the present invention provides a compound semiconductor single crystal which has a silicon (Si) concentration of not more than $1 \times 10^{17}$ atoms/cm$^3$ and/or an oxygen (O) concentration of not more than $7 \times 10^{16}$ atoms/cm$^3$.

Si and/or O when exceeding the specified amount produces precipitation of SiO$_2$ in the substrate which precipitation will increase the amount of defects generated in a subsequent epitaxial growth process and eventually results in the occurrence of the inadequate luminance problem.

The compound semiconductor single crystal provided in accordance with this invention is a GaP single crystal.

The compound semiconductor of this invention is suitable for use as a substrate for epitaxial deposition of a light-emitting device which emits green light.

Many other objects, advantages and features of the present invention will be better understood from the following description taken in conjunction with the accompanying drawings.

DETAILED DESCRIPTION OF THE INVENTION

One embodiment of this invention will now be described with reference to the accompanying drawings.

Figure 2:
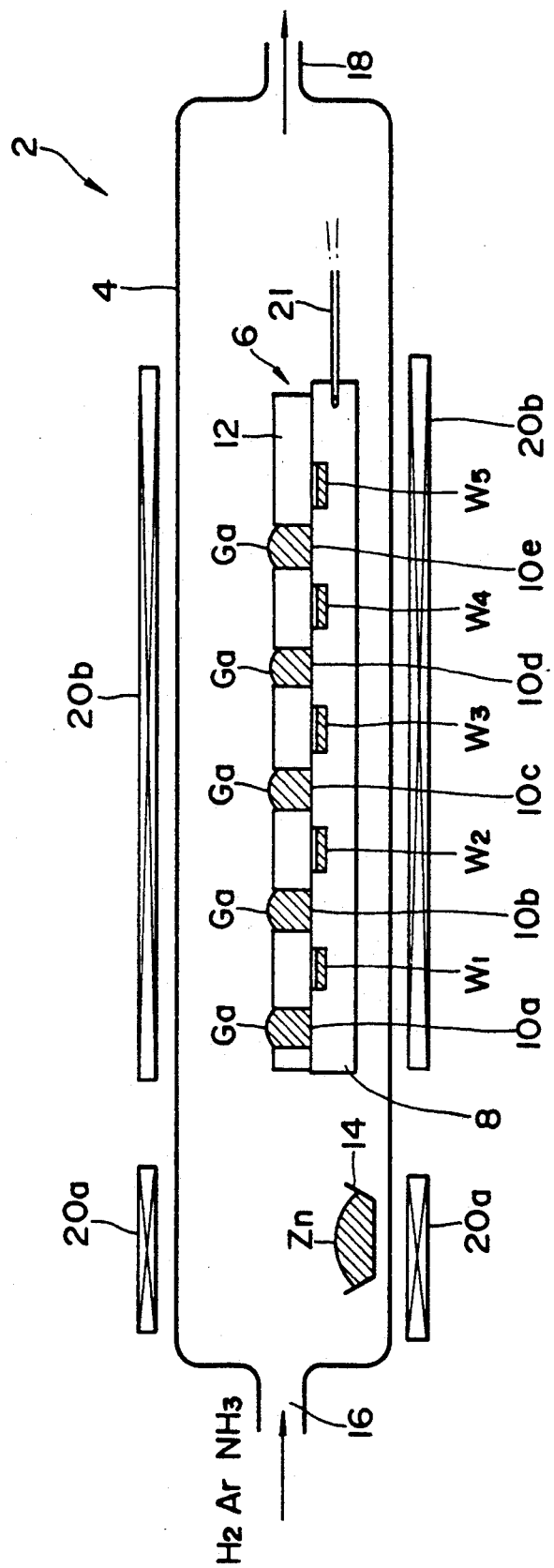
FIG. 2 is a diagrammatical side view of a liquid-phase epitaxial growth system used in Example 1 of the present invention.

FIG. 2 shows a liquid-phase epitaxial growth system 2 used in Example 1 described later.

The liquid-phase epitaxial growth system 2 includes a reaction tube 4 made of quartz in which a growth boat 6 is disposed. The growth boat 6 includes a substrate holder 8 for holding therein a plurality (five in the illustrated embodiment) of GaP substrates W1-W5 arranged in the longitudinal direction thereof, and a solution holding boat 12 disposed on the substrate holder 8 and having a plurality of growth solution pits 10a-10e each provided for a corresponding one of the GaP substrates W1-W5 and holding therein a solution used for the liquid-phase epitaxy. The substrate holder 8 and the solution holding boat 12 are slidable relative to one another.

A dopant evaporation source 14 comprised of Zn, for example, is disposed at a position spaced a distance from the growth boat 6. The reaction tube 4 has at its one end a gas supply port 16 from which a gas is supplied into the reaction tube 4 and, at the opposite end, a gas discharge port 18 from which the gas is discharged from the reaction tube 4.

Reference characters 20a and 20b are heaters disposed around the reaction tube 4, and numeral 21 is a pull rod for reciprocating the growth boat 6.

The invention will be further described by way of the following example which should be construed as illustrative rather than restrictive.

EXAMPLE 1

Using 14 samples of GaP single crystal substrates fabricated by the LEC method with different concentrations of silicon and oxygen as shown in Table 1, liquid-phase epitaxial layers were grown in the liquid-phase epitaxial growth system 2 shown in FIG. 2 in order to fabricate epitaxial wafers for a green light LED.

The liquid-phase epitaxial growth was performed in the manner described below.

(1) In an H$_2$ atmosphere, the temperature was elevated to 1000° C., thus causing GaP polycrystal to melt down into a Ga melt.

(2) The pull rod 21 was manipulated to bring the substrates W1-W5 into contact with the Ga melt.

(3) The temperature was elevated to 1010° C., thus causing a portion of each substrate to melt back into the Ga melt.

(4) The system 2 was gradually cooled down at the rate of 1°-3° C. per minute during which time an n-type layer was grown first.

(5) While supplying H$_2$ and NH$_3$ from the gas supply port 16, the system 2 is continuously cooled so that an n-type layer added with N was grown.

(6) The dopant evaporation source 14 was heated to generate a Zn vapor and while supplying the Zn vapor and H$_2$, the system 2 was continuously cooled so that a p-type epitaxial layer was grown.

(7) Finally, the pull rod 21 was manipulated to separate the Ga melt and the substrates W1-W5, thereby terminating the epitaxial growth.

To the epitaxial wafers thus produced, a p-type electrode of an Au alloy and an n-type electrode of an Au alloy were formed by vapor deposition. Subsequently, the wafers were cut into 0.3 mm-square pellet-like, green light LEDs. Then, the luminance of the LEDs thus fabricated were measured under the following conditions.

Header: TO-18 header
Epoxy coating: none
DC forward current ($I_f$): 10 mA

Using a criterion of 4.5 mcd, the measured LEDs were classified into two groups depending on their luminance levels, i.e., non-defective LEDs having luminance levels not less than 4.5, and defective LEDs having luminance levels less than 4.5 mcd. Then, the measurements on the luminance were analyzed in respect of a relation to the conjunction with the concentrations of impurities Si and O. The results thus obtained are shown in FIG. 1.

Figure 1:
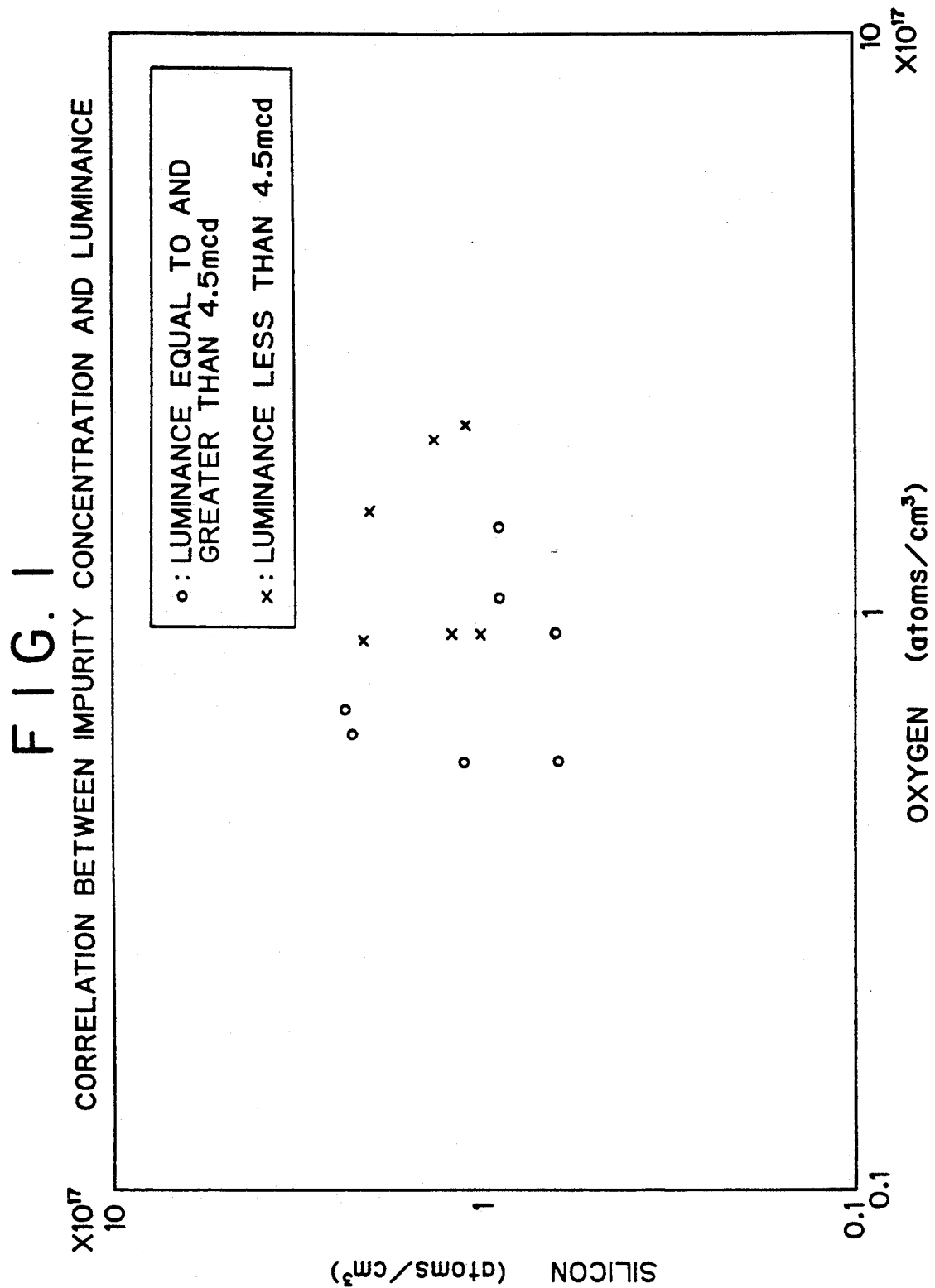
FIG. 1 is a graph showing a correlation between the concentrations of Si and O in compound semiconductor single crystals and the luminance of LEDs using the compound semiconductor single crystals.

In FIG. 1, the mark "o" represents an LED which was free from precipitation of $SiO_2$ and exhibited a luminance of 4.5 mcd or more, and the mark "x" represents an LED which involved a local precipitation of $SiO_2$ and, due to this crystal defect, were only able to exhibit a luminance less than 4.5 mcd.

It can be understood from FIG. 1 that a substrate which is suitable for use in epitaxial deposition of a luminance-reduction-free green light LED has a specified range of impurity concentration, that is, an Si concentration of not more than $1 \times 10^{17}$ atoms/cm$^3$, or an O concentration of not more than $7 \times 10^{16}$ atoms/cm$^3$ when the Si concentration exceeds $1 \times 10^{17}$ atoms/cm$^3$. In other words, an LED which is capable of emitting green light with an adequate luminance can be obtained by using a compound semiconductor substrate which has an Si concentration of not more than $1 \times 10^{17}$ atoms/cm$^3$ and/or an O concentration of more than $7 \times 10^{16}$ atoms/cm$^3$.

As described above, a compound semiconductor single crystal of this invention and a GaP single crystal, in particular, is particularly suitable for use as a substrate for epitaxial deposition of a light-emitting device which is able to emit green light without involving an inadequate luminance problem.

TABLE 1

| No. | Si Concentration | O Concentration |
|-----|------------------|-----------------|
| 1   | 0.63             | 0.56            |
| 2   | 1.12             | 0.56            |
| 3   | 2.22             | 0.63            |
| 4   | 2.31             | 0.69            |
| 5   | 2.07             | 0.91            |
| 6   | 1.20             | 0.93            |
| 7   | 1.02             | 0.93            |
| 8   | 0.63             | 0.93            |
| 9   | 0.89             | 1.07            |
| 10  | 0.10             | 1.08            |
| 11  | 0.89             | 1.40            |
| 12  | 1.35             | 2.00            |
| 13  | 1.10             | 2.10            |
| 14  | 2.00             | 1.50            |

(Concentration: $\times 10^{17}$ atoms/cm$^3$)

What is claimed is:

1. A compound semiconductor single crystal having a GaP substrate, wherein said substrate contains an impurity concentration in an amount insufficient to cause precipitation of sufficient silica to increase the amount of defects generated by a subsequent epitaxial growth process, of at least one of not more than $1 \times 10^{17}$ atoms/cm$^3$ of silicon and not more than $7 \times 10^{16}$ atoms/cm$^3$ of oxygen in said substrate.

2. A composit of a compound semiconductor single crystal as claimed in claim 1 and an epitaxial deposit thereon of a light-emitting device which emits green light.

3. A green light emitting composit as claimed in claim 2 wherein said substrate has an impurity concentration limit of both not more than $1 \times 10^{17}$ atoms/cm$^3$ of silicon and not more than $7 \times 10^{16}$ atoms/cm$^3$ of oxygen.

4. A green light emitting composit as claimed in claim 2 wherein the amount of silicon or oxygen impurity contained in said substrate is insufficient to impair the luminance thereof.

5. In the method of emitting light, including green light, from a light emitting diode, which diode comprises:
   a GaP single crystal semiconducting substrate, and
   an epitaxial deposit on at least one surface of said substrate comprising a green light emitting device; wherein said method comprises energizing said diode to an extent sufficient to cause said green light to be emitted thereby;
   the improvement, whereby enhancing the green light emitted by said diode, which comprises:
   forming said diode while limiting:
      the impurity concentration in said GaP single crystal substrate to at least one of a green light emission enhancing amount of silicon which is not more than $1 \times 10^{17}$ atoms per cm$^3$, and
      a green light emission enhancing amount of oxygen which is not more than $7 \times 10^{16}$ atoms per cm$^3$, and
   then energizing said diode to an extent sufficient to produce light, with enhanced green light, therefrom.

6. An improved method as claimed in claim 5 wherein both said silicon and said oxygen amounts are limited.

* * * * *